(12) United States Patent
Kim et al.

(10) Patent No.: US 11,800,634 B2
(45) Date of Patent: Oct. 24, 2023

(54) HEAT SINK FASTENING STRUCTURE

(71) Applicant: Samsung Electronics Co., Ltd., Suwon-si (KR)

(72) Inventors: Juhyeok Kim, Suwon-si (KR); Boik Cho, Suwon-si (KR); Jieun Ha, Suwon-si (KR); Sangeun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 350 days.

(21) Appl. No.: 17/025,453

(22) Filed: Sep. 18, 2020

(65) Prior Publication Data
US 2021/0084745 A1   Mar. 18, 2021

(30) Foreign Application Priority Data
Sep. 18, 2019   (KR) .................. 10-2019-0114546

(51) Int. Cl.
*H01L 23/40* (2006.01)
*H05K 1/02* (2006.01)

(52) U.S. Cl.
CPC ............ *H05K 1/021* (2013.01); *H01L 23/40* (2013.01); *H05K 2201/066* (2013.01); *H05K 2201/10598* (2013.01)

(58) Field of Classification Search
CPC ......... H01L 23/4093; H01L 2023/4087; H01L 2023/4081; H01L 2023/4075; H01L 23/4006; H01L 23/40
USPC ........................................ 165/80.2
See application file for complete search history.

(56) References Cited

U.S. PATENT DOCUMENTS

| | | | | |
|---|---|---|---|---|
| 6,331,937 B1* | 12/2001 | Bartyzel | ............ | H01L 23/4093 361/720 |
| 6,392,889 B1* | 5/2002 | Lee | ...................... | H01L 23/4093 24/453 |
| 2004/0238947 A1* | 12/2004 | Rumer | ..................... | H01L 23/40 257/E23.083 |
| 2005/0067178 A1* | 3/2005 | Pearson | ............. | H05K 13/0465 257/E23.083 |
| 2008/0284005 A1* | 11/2008 | Wong | ................... | H01L 23/4093 257/727 |
| 2010/0053904 A1* | 3/2010 | Chen | .................... | H01L 23/4093 361/720 |
| 2011/0103023 A1* | 5/2011 | Cheng | ................. | H01L 23/4093 361/720 |
| 2011/0157831 A1* | 6/2011 | Nie | ...................... | H01L 23/4006 411/103 |

(Continued)

FOREIGN PATENT DOCUMENTS

KR   10-2010-0065813   6/2010

*Primary Examiner* — Frantz F Jules
*Assistant Examiner* — Jason N Thompson
(74) *Attorney, Agent, or Firm* — STAAS & HALSEY LLP

(57) ABSTRACT

A heat sink fastening structure includes a push pin to fasten a heat sink to a printed circuit board (PCB) and including a head portion formed at an end thereof, a bracket mounted on the PCB and including a through hole formed at a central portion thereof to allow the head portion to penetrate, and an accommodating hole included in the PCB to accommodate the head portion therein, and the head portion is configured to penetrate the through hole and thereafter be accommodated in the accommodating hole, to thereby be fixed to the bracket.

18 Claims, 11 Drawing Sheets

(56) References Cited

U.S. PATENT DOCUMENTS

2013/0189049 A1\* 7/2013 Stotz, Jr. ............... F16B 5/0266
411/111
2014/0016272 A1\* 1/2014 Chiang ................ H01L 23/552
361/720
2020/0273774 A1\* 8/2020 Lin ..................... H01L 23/4093

\* cited by examiner

HEAT SINK FASTENING STRUCTURE

CROSS-REFERENCE TO RELATED APPLICATIONS

This application is based on and claims priority under 35 U.S.C. § 119 to Korean Patent Application No. 10-2019-0114546, filed on Sep. 18, 2019, in the Korean Intellectual Property Office, the disclosure of which is incorporated by reference herein in its entirety.

BACKGROUND

1. Field

The disclosure relates to a heat sink fastening structure for fastening a heat sink to a printed circuit board (PCB).

2. Description of the Related Art

In general, a heat sink is a device that is attached to a printed circuit board (PCB) and radiates heat generated from chips to the outside in order to dissipate heat generated from the chips of various electronic products.

The heat sink is fastened to the PCB by push pins or screws.

When the heat sink is fastened to the PCB by screws, the height thereof may be reduced compared to the case where the heat sink is fastened to the PCB by push pins, but the heat transfer efficiency thereof may be changed depending on the amount of torque to fasten the screws. When the amount of torque changes, the chip may break.

When the heat sink is fastened to the PCB by the push pin, a head portion of the push pin may protrude from a lower end of the PCB, so that the thickness of a product may be thickened as a whole.

SUMMARY

It is an aspect of the disclosure to provide a heat sink fastening structure capable of reducing an overall thickness of a product by allowing a head portion of a push pin provided on a heat sink to be accommodated in a hole formed on a PCB.

It is another aspect of the disclosure to provide a heat sink fastening structure in which a bracket is mounted on the PCB so that the push pin of the heat sink may be fixed to the bracket.

Additional aspects of the disclosure will be set forth in part in the description which follows and, in part, will be obvious from the description, or may be learned by practice of the disclosure.

In accordance with an aspect of the disclosure, a heat sink fastening structure for fastening a heat sink to a PCB includes a push pin provided on the heat sink and including a head portion formed at an end thereof, a bracket mounted on the PCB and including a through hole formed at a central portion thereof to allow the head portion to penetrate, and an accommodating hole provided on the PCB to accommodate the head portion, wherein the head portion is accommodated in the accommodating hole by penetrating the through hole and fixed to the bracket.

The push pin may include the head portion penetrating the through hole and accommodated in the accommodating hole, a push portion to which a force is applied so that the head portion penetrates the through hole, a connection portion connecting the push portion and the head portion and configured to penetrate the heat sink, and an elastic member provided between the push portion and the heat sink.

The accommodating hole may have a diameter larger than a size of the head portion.

The head portion may be configured to be elastically deformable.

When a force is applied to the push portion, an end portion of the head portion may be inserted into the through hole while the elastic member is compressed, and the head portion inserted into the through hole may penetrate the through hole by being elastically deformed to become smaller in size.

The head portion passed through the through hole may be elastically deformed to an original size thereof, and the end portion of the head portion may penetrate the accommodating hole to be exposed to the outside of the PCB.

When the end portion of the head portion penetrates the accommodating hole to be exposed to the outside of the PCB, the force applied to the push portion may be released.

When the force applied to the push portion is released, the push portion may be moved in a direction opposite to a direction in which the force is applied to the push portion together with the head portion by an elastic force of the elastic member so that the head portion is fixed to the bracket.

The head portion may be formed in a straight bar shape.

The through hole may be formed in a shape corresponding to the head portion to allow the head portion to penetrate.

The accommodating hole may include a first accommodating hole formed in a shape corresponding to the head portion and having a size larger than that of the head portion, and a second accommodating hole disposed perpendicular to the first accommodating hole so that the accommodating hole is formed in a cross shape.

When a force is applied to the push portion, the head portion may be exposed to the outside of the PCB by penetrating the through hole and the first accommodating hole while the elastic member is compressed.

When the head portion penetrates the first accommodating hole to be exposed to the outside of the PCB, the push pin may be rotated by 90 degrees to allow the head portion to pass through the second accommodating hole.

When the push pin is rotated by 90 degrees, the force applied to the push portion may be released, and when the force applied to the push portion is released, the push portion may be moved in a direction opposite to a direction in which the force is applied to the push portion together with the head portion by an elastic force of the elastic member so that the head portion is fixed to the bracket.

The bracket may include a plurality of fixing portions fixed to the PCB, and the PCB may include a plurality of fixing holes into and to which the plurality of fixing portions is inserted and fixed.

In accordance with another aspect of the disclosure, a heat sink fastening structure for fastening a heat sink to a PCB includes a push pin provided on the heat sink and including a head portion configured to be elastically deformable, a bracket mounted on the PCB and including a through hole formed at a central portion thereof to allow the head portion to penetrate, and an accommodating hole provided on the PCB to accommodate the head portion, wherein the head portion penetrates through the through hole by being elastically deformed to become smaller in size and is fixed to the bracket by being elastically deformed to an original size thereof while being accommodated in the accommodating hole.

The push pin may include a push portion to which a force is applied so that the head portion penetrates the through hole, a connection portion connecting the push portion and the head portion and configured to penetrate the heat sink, and an elastic member provided between the head portion and the heat sink.

In accordance with another aspect of the disclosure, a heat sink fastening structure for fastening a heat sink to a PCB includes a push pin provided on the heat sink and including a head portion formed in a straight bar shape, a bracket mounted on the PCB and including a through hole formed at a central portion thereof and having a shape corresponding to the head portion to allow the head portion to penetrate, and an accommodating hole provided on the PCB to accommodate the head portion and including a first accommodating hole formed in a shape corresponding to the head portion and having a size larger than that of the head portion, and a second accommodating hole disposed perpendicular to the first accommodating hole so that the accommodating hole is formed in a cross shape, wherein when the head portion penetrates the through hole and the first accommodating hole, the head portion is fixed to the bracket by rotating the push pin by 90 degrees to allow the head portion to pass through the second accommodating hole and not to pass through the through hole.

The push pin may include a push portion to which a force is applied so that the head portion penetrates the through hole, a connection portion connecting the push portion and the head portion and configured to penetrate the heat sink, and an elastic member provided between the head portion and the heat sink.

When a force is applied to the push portion, the head portion may be moved to penetrate the through hole and the first accommodating hole while the elastic member is compressed, and when the push pin is rotated by 90 degrees and then the force applied to the push portion is released, the head portion may be fixed to the bracket by being moved to be accommodated in the second accommodating hole by an elastic force of the elastic member.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Configurations shown in the embodiments and the drawings described in the present specification are only the preferred embodiments of the present disclosure, and thus it is to be understood that various modified examples, which may replace the embodiments and the drawings described in the present specification, are possible when filing the present application.

Like reference numbers or signs in the various figures of the application represent parts or components that perform substantially the same functions.

The terms used herein are for the purpose of describing the embodiments and are not intended to restrict and/or to limit the disclosure. For example, the singular expressions herein may include plural expressions, unless the context clearly dictates otherwise. Also, the terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that although the terms first, second, etc. may be used herein to describe various components, these components should not be limited by these terms, and the terms are only used to distinguish one component from another. For example, without departing from the scope of the disclosure, the first component may be referred to as a second component, and similarly, the second component may also be referred to as a first component. The term "and/or" includes any combination of a plurality of related items or any one of a plurality of related items.

The terms "front surface," "rear surface," "front side," "rear side," "upper portion," "lower portion," "upper end," "lower end," "left side," "right side," and the like used in the following description are defined with reference to the drawings, and the shape and position of each component are not limited by these terms.

Hereinafter, embodiments of the disclosure will be described in detail with reference to the accompanying drawings.

Figure 1:
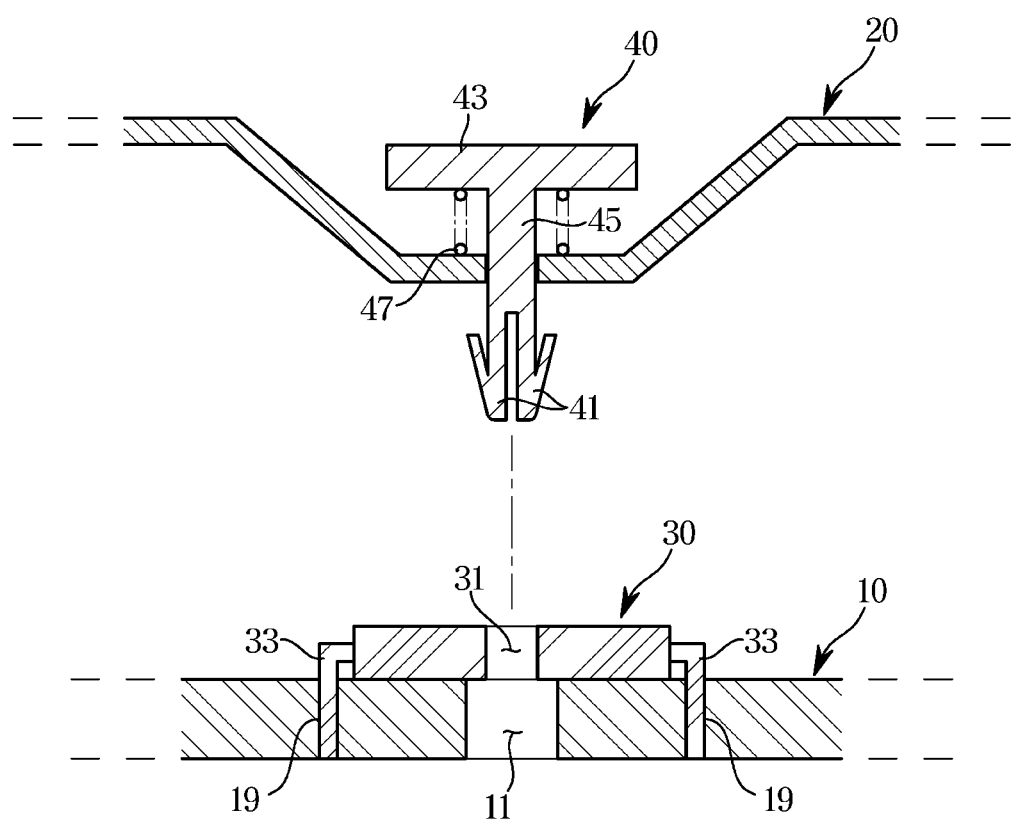
FIG. 1 schematically illustrates a process in which a heat sink according to an embodiment of the disclosure is fastened to a PCB on which a bracket is mounted.
Figure 2:
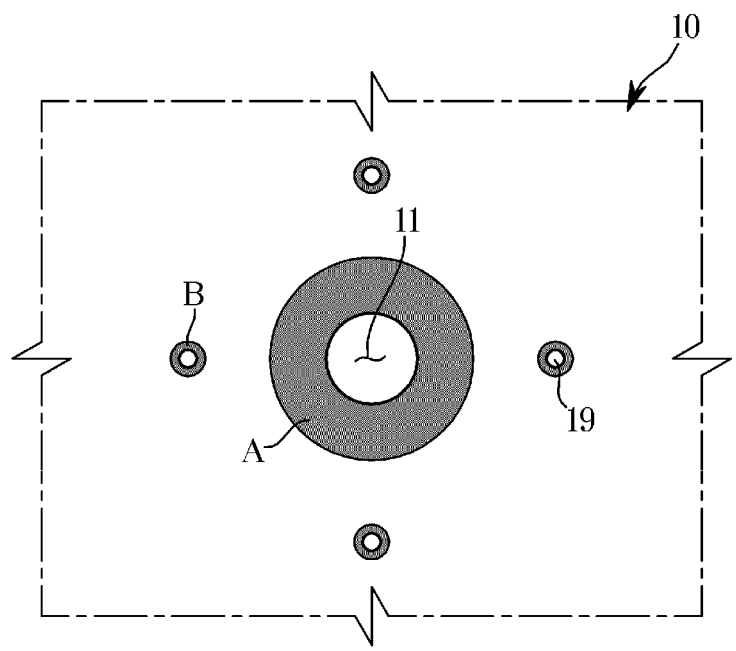
FIG. 2 schematically illustrates that an accommodating hole and fixing holes are formed on the PCB according to an embodiment of the disclosure.
Figure 3:
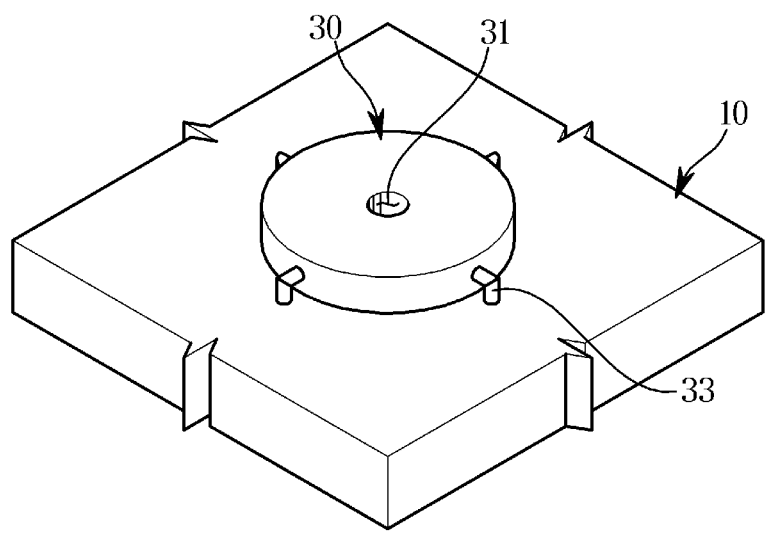
FIG. 3 schematically illustrates that the bracket is mounted on the PCB according to an embodiment of the disclosure.

FIG. 1 schematically illustrates a process in which a heat sink according to an embodiment of the disclosure is fastened to a PCB on which a bracket is mounted, FIG. 2 schematically illustrates that an accommodating hole and fixing holes are formed on the PCB according to an embodiment of the disclosure, and FIG. 3 schematically illustrates that the bracket is mounted on the PCB according to an embodiment of the disclosure.

As illustrated in FIGS. 1 to 3, a heat sink fastening structure for fastening a heat sink 20 to a PCB 10 may include a plurality of push pins 40 provided on the heat sink 20, and a plurality of brackets 30 mounted on the PCB 10 and to which the push pins 40 are fixed.

Various electronic products in which the PCB 10 is used may be provided with the heat sink 20 to radiate heat generated from a chip (not shown) mounted on the PCB 10 to the outside.

In order to fasten the heat sink 20 to the PCB 10, the PCB 10 may include a plurality of accommodating holes 11 in which head portions 41 of the push pins 40 are accommodated, and a plurality of fixing holes 19 to which the plurality of brackets 30 is fixed, which will be described later.

The heat sink 20 may include the plurality of push pins 40 to fasten the heat sink 20 to the PCB 10.

The plurality of brackets 30 may be mounted on the PCB 10 in order to fasten the heat sink 20 to the PCB 10. The plurality of brackets 30 and the plurality of push pins 40 may have corresponding numbers.

Each of the plurality of brackets 30 may include a through hole 31 through which the head portion 41 of the push pin 40 penetrates, and a plurality of fixing portions 33 fixed to the PCB 10. The through hole 31 may be provided at a central portion of the bracket 30. The through hole 31 may be formed in a circular shape. The plurality of fixing portions 33 may be inserted into the plurality of fixing holes 19 formed on the PCB 10.

Lead may be applied to a first region A around the accommodating hole 11 of the PCB 10 in order to mount the bracket 30 on the PCB 10. The center of the through hole 31 of the bracket 30 is matched with the center of the accommodating hole 11 so that a lower surface of the bracket 30 may be mounted on the PCB 10 by the lead applied to the PCB 10. Lead may also be applied to a second region B around the plurality of fixing holes 19 formed on the PCB 10 in order to more securely fix the bracket 30 to the PCB 10. Because the bracket 30 is mounted on the PCB 10 by the lead applied to the first region A around the accommodating hole 11 of the PCB 10 and the second region B around the plurality of fixing holes 19, the bracket 30 may be securely fixed to the PCB 10. The drawings illustrate four of the fixing portions 33 formed on the bracket 30 and four of the fixing holes 19 formed on the PCB 10, but are not limited thereto. Although not shown in the drawings, the bracket 30 may have a height equal to or lower than the height of a chip having the highest height among chips mounted on the PCB 10.

A plurality of the push pins 40 may be provided on the heat sink 20. The push pin 40 may include the head portion 41 penetrating the through hole 31 formed on the bracket 30 and accommodated in the accommodating hole 11 of the PCB 10, a push portion 43 to which a force is applied so that the head portion 41 penetrates the through hole 31, a connection portion 45 connecting the push portion 43 and the head portion 41, and an elastic member 47 provided between the push portion 43 and the heat sink 20.

The head portion 41 may be elastically deformable such that the size thereof may become smaller or larger. The head portion 41 has the smallest size at an end portion and may become larger in size toward an upward direction. The through hole 31 through which the head portion 41 penetrates may have a diameter through which the head portion 41 may penetrate when the head portion 41 becomes smaller in size by being elastically deformed. The accommodating hole 11 in which the head portion 41 passed through the through hole 31 is accommodated may have a diameter larger than the size of the head portion 41. When the head portion 41 penetrates the through hole 31 by being elastically deformed to become smaller in size and then is accommodated in the accommodating hole 11, the head portion 41 may be elastically deformed again to an original size thereof. When the head portion 41 is elastically deformed to have the original size, the head portion 41 may not be able to penetrate the through hole 31 in a direction opposite to the insertion direction. Accordingly, the head portion 41 is not able to penetrate the through hole 31 and may be caught on and fixed to the bracket 30. The head portion 41 may be located below the heat sink 20 in the drawing.

The push portion 43 is positioned above the head portion 41 in the drawing and may be located above the heat sink 20. In order to fasten the heat sink 20 to the PCB 10, a force may be applied to the push portion 43 so that the push portion 43 directs to a downward direction. When a force is applied to the push portion 43, the push portion 43 may be moved in a direction in which the force is applied to the push portion 43 while compressing the elastic member 47. When the push portion 43 is moved in the direction in which the force is applied, the head portion 41 may be moved in the direction in which the force is applied to the push portion 43 together with the push portion 43 to be inserted into the through hole 31.

The connection portion 45 may connect the head portion 41 and the push portion 43. The connection portion 45 may be provided to penetrate the heat sink 20. When the head portion 41 and the push portion 43 are connected by the connection portion 45 and a force is applied to the push portion 43, the head portion 41 may be moved together with the push portion 43.

The elastic member 47 may be provided between an upper surface of the heat sink 20 and the push portion 43. When a force is applied to the push portion 43 and the push portion 43 is moved in the downward direction in the drawing, the elastic member 47 provided between the push portion 43 and the heat sink 20 may be compressed. When the force applied to the push portion 43 is released after the elastic member 47 is compressed, the push portion 43 may be moved in a direction opposite to a direction in which the force is applied to the push portion 43 by an elastic force of the elastic member 47. That is, the push portion 43 may be moved in the upward direction in the drawing. When the push portion 43 is moved in the upward direction, the head portion 41 may also be moved in the upward direction. The head portion 41 moved in the upward direction by the elastic force of the elastic member 47 may be fixed to the bracket 30 to allow the push pin 40 to be fixed to the bracket 30.

Next, a process in which the heat sink is fastened to the PCB will be described in detail with reference to FIGS. 4 and 5.

Figure 4:
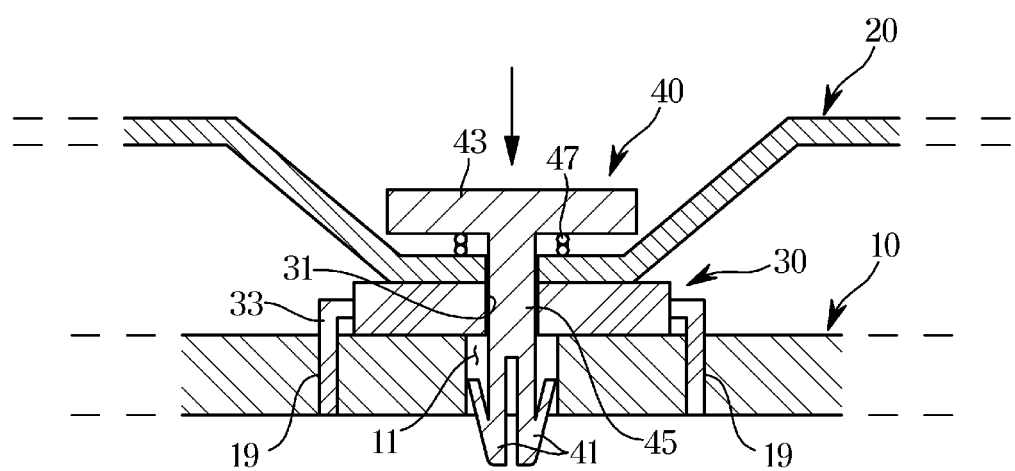
FIG. 4 schematically illustrates that a force is applied to a push portion of a push pin according to an embodiment of the disclosure, so that a head portion of the push pin penetrates a through hole.
Figure 5:
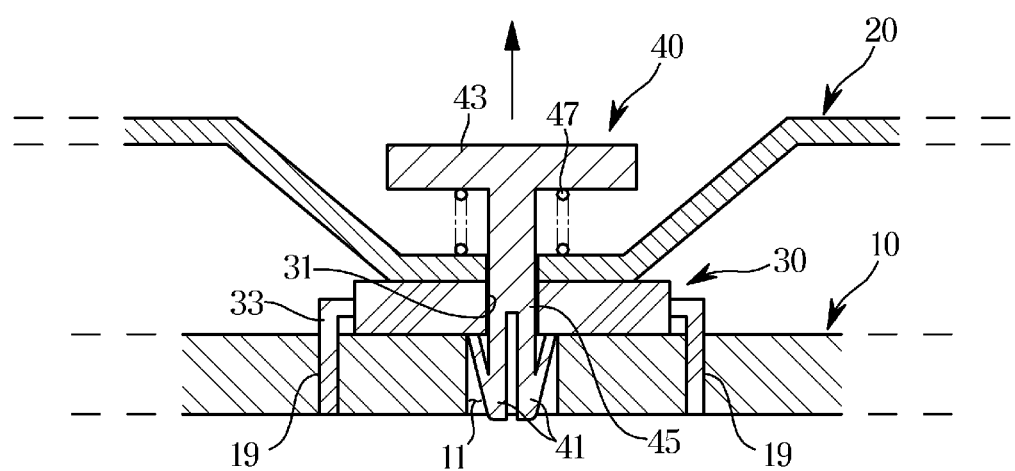
FIG. 5 schematically illustrates that the head portion of the push pin according to an embodiment of the disclosure is fixed to the bracket.

FIG. 4 schematically illustrates that a force is applied to a push portion of a push pin according to an embodiment of the disclosure, so that a head portion of the push pin penetrates a through hole, and FIG. 5 schematically illustrates that the head portion of the push pin according to an embodiment of the disclosure is fixed to the bracket.

For convenience of description, a direction in which a force is applied to the push portion 43 is referred to as a downward direction, and a direction opposite to a direction in which a force is applied to the push portion 43 is referred to an upward direction.

As illustrated in FIG. 4, when a force is applied to the push portion 43, the push portion 43 is moved in a downward direction to compress the elastic member 47 and an end portion of the head portion 41 may be inserted into the through hole 31. When the force is continuously applied to the push portion 43 after the end portion of the head portion 41 is inserted into the through hole 31, the head portion 41 may penetrate the through hole 31 by being elastically deformed to become smaller in size. The head portion 41 passed through the through hole 31 may be accommodated in the accommodating hole 11. The head portion 41 accommodated in the accommodating hole 11 may be elastically deformed to have the original size. In this case, the end portion of the head portion 41 may penetrate the accommodating hole 11 and be exposed to the outside of the PCB 10. When the end portion of the head portion 41 penetrates the accommodating hole 11 so as to be exposed to the outside of the PCB 10, the force applied to the push portion 43 may be released, as illustrated in FIG. 5.

When the force applied to the push portion 43 is released, the push portion 43 may be moved in an upward direction by the elastic force of the elastic member 47. When the push portion 43 is moved in the upward direction, the head portion 41 connected to the push portion 43 by the connection portion 45 may also be moved in the upward direction. When the head portion 41 is moved in the upward direction in a state of being elastically deformed state so that the size of the head portion 41 becomes the original size, the head portion 41 may become a size that is not able to penetrate the through hole 31. Accordingly, the head portion 41 may be fixed to the bracket 30, and the push pin 40 may be fixed to prevent separation from the bracket 30.

Figure 6:
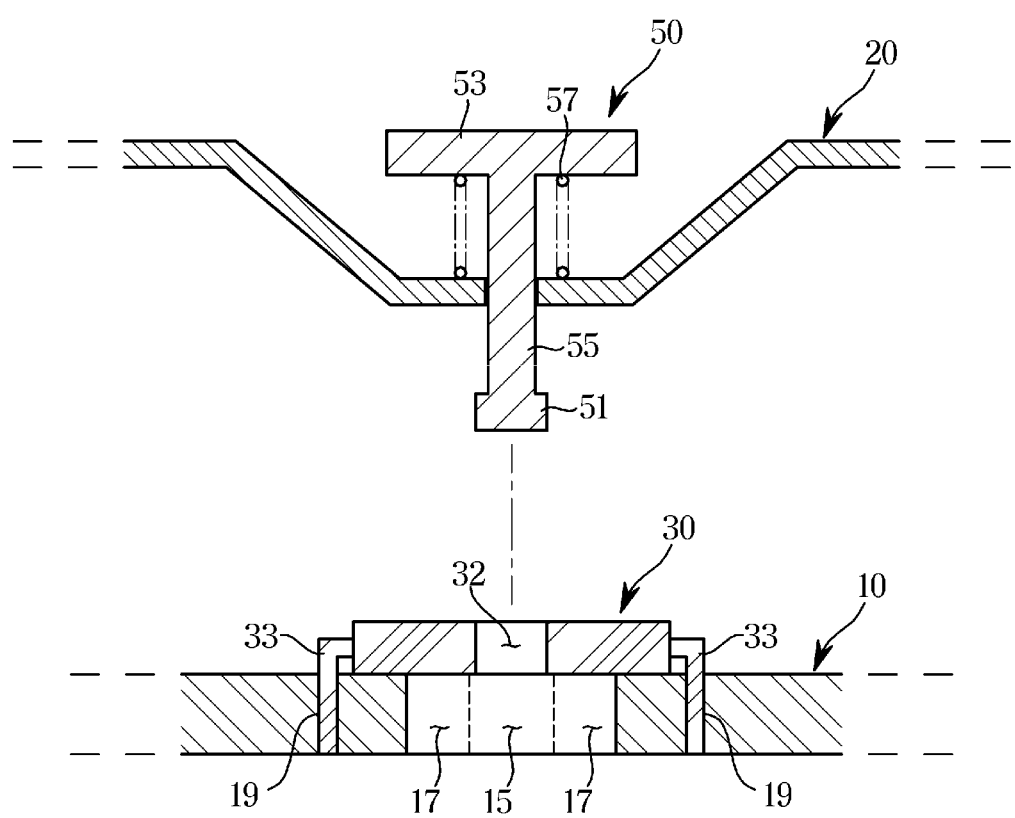
FIG. 6 schematically illustrates a process in which a heat sink according to another embodiment of the disclosure is fastened to a PCB on which a bracket is mounted.
Figure 7:
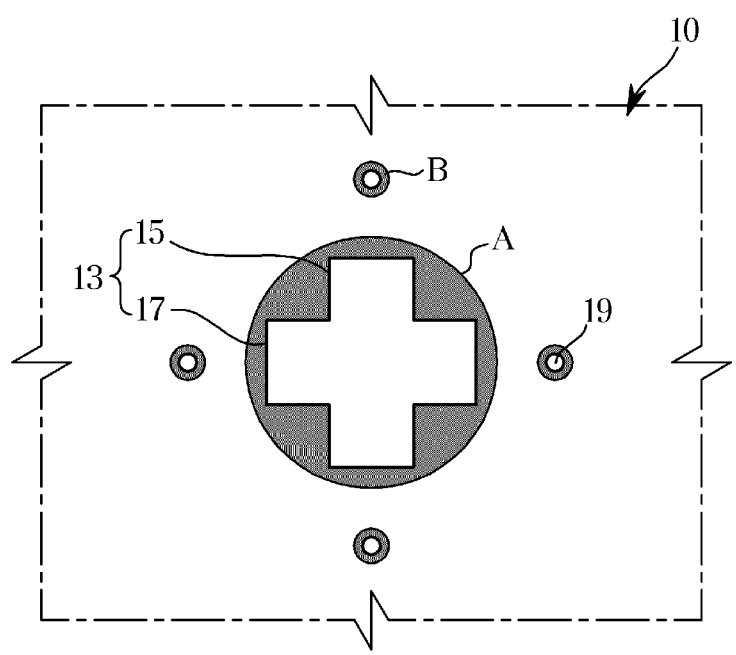
FIG. 7 schematically illustrates that an accommodating hole and fixing holes are formed on the PCB according to another embodiment of the disclosure.
Figure 8:
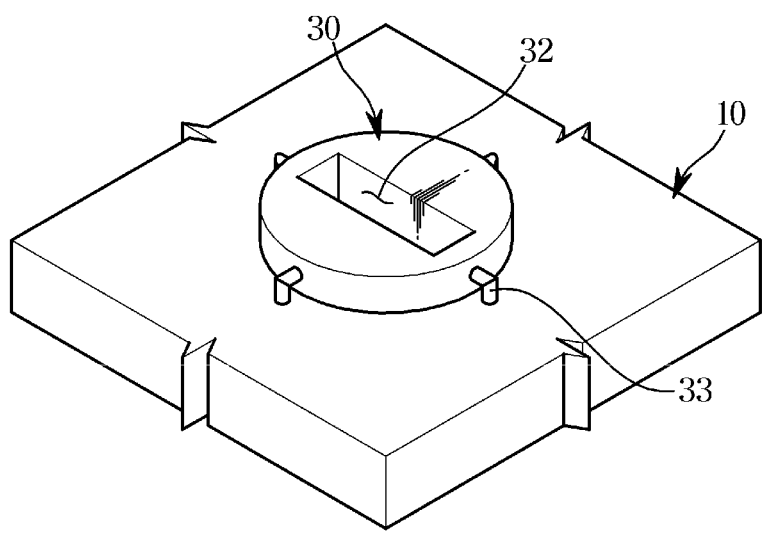
FIG. 8 schematically illustrates that the bracket is mounted on the PCB according to another embodiment of the disclosure.

FIG. 6 schematically illustrates a process in which a heat sink according to another embodiment of the disclosure is fastened to a PCB on which a bracket is mounted, FIG. 7 schematically illustrates that an accommodating hole and fixing holes are formed on the PCB according to another embodiment of the disclosure, and FIG. 8 schematically illustrates that the bracket is mounted on the PCB according to another embodiment of the disclosure.

As illustrated in FIGS. 6 to 8, a heat sink fastening structure for fastening the heat sink 20 to the PCB 10 may include a plurality of push pins 50 provided on the heat sink 20, and the plurality of brackets 30 mounted on the PCB 10 and to which the push pins 50 are fixed.

In order to fasten the heat sink 20 to the PCB 10, the PCB 10 may include a plurality of accommodating holes 13 in which head portions 51 of the push pins 50 are accommodated, which will be described later, and the plurality of fixing holes 19 to which the plurality of brackets 30 is fixed. The plurality of accommodating holes 13 may be formed in a cross shape. Each of the plurality of accommodating holes 13 may include a first accommodating hole 15 having a shape corresponding to the head portion 51 of the push pin 50 and having a size larger than that of the head portion 51, and a second accommodating hole 17 disposed perpendicular to the first accommodating hole 15 so that the plurality of accommodating holes 13 is formed in a cross shape, which will be described later. The second accommodating hole 17 may have the same size as the first accommodating hole 15.

The heat sink 20 may include the plurality of push pins 50 to fasten the heat sink 20 to the PCB 10.

The plurality of brackets 30 may be mounted on the PCB 10 in order to fasten the heat sink 20 to the PCB 10. The plurality of brackets 30 and the plurality of push pins 50 may have corresponding numbers.

Each of the plurality of brackets 30 may include a through hole 32 through which the head portion 51 of the push pin 50 penetrates, and the plurality of fixing portions 33 fixed to the PCB 10. The through hole 32 may be provided at a central portion of the bracket 30. The through hole 32 may be formed in a straight bar shape. The plurality of fixing portions 33 may be inserted into the plurality of fixing holes 19 formed on the PCB 10.

Lead may be applied to the first region A around the accommodating hole 13 of the PCB 10 in order to mount the bracket 30 on the PCB 10. The center of the through hole 32 of the bracket 30 is matched with the center of the accommodating hole 13 so that the lower surface of the bracket 30 may be mounted on the PCB 10 by the lead applied to the PCB 10. Lead may also be applied to the second region B around the plurality of fixing holes 19 formed on the PCB 10 in order to more securely fix the bracket 30 to the PCB 10. Because the bracket 30 is mounted on the PCB 10 by the lead applied to the first region A around the accommodating hole 13 of the PCB 10 and the second region B around the plurality of fixing holes 19, the bracket 30 may be securely fixed to the PCB 10. The drawings illustrate four of the fixing portions 33 formed on the bracket 30 and four of the fixing holes 19 formed on the PCB 10, but are not limited thereto. Although not shown in the drawings, the bracket 30 may have a height equal to or lower than the height of a chip having the highest height among chips mounted on the PCB 10.

A plurality of the push pins 50 may be provided on the heat sink 20. The push pin 40 may include the head portion 51 penetrating the through hole 32 formed on the bracket 30 and accommodated in the accommodating hole 13 of the PCB 10, a push portion 53 to which a force is applied so that the head portion 51 penetrates the through hole 32, a connection portion 55 connecting the push portion 53 and the head portion 51, and an elastic member 57 provided between the push portion 53 and the heat sink 20.

The head portion 51 may be formed in a straight bar shape. The through hole 32 through which the head portion 51 penetrates may be formed in a shape corresponding to the head portion 51 so that the head portion 51 may penetrate. The accommodating hole 13 in which the head portion 51 passed through the through hole 32 is accommodated may have a size larger than that of the head portion 51.

The push portion 53 is positioned above the head portion 51 in the drawing and may be located above the heat sink 20. In order to fasten the heat sink 20 to the PCB 10, a force may be applied to the push portion 43 so that the push portion 53 directs to the downward direction. When a force is applied to the push portion 53, the push portion 53 may be moved in a direction in which the force is applied to the push portion 53 while compressing the elastic member 57. When the push portion 53 is moved in the direction in which the force is applied, the head portion 51 may be moved in the direction in which the force is applied to the push portion 53 together with the push portion 53 to be inserted into the through hole 32.

The connection portion 55 may connect the head portion 51 and the push portion 53. The connection portion 55 may be provided to penetrate the heat sink 20. When the head portion 51 and the push portion 53 are connected by the connection portion 55 and a force is applied to the push portion 53, the head portion 51 may be moved together with the push portion 53.

The elastic member 57 may be provided between the upper surface of the heat sink 20 and the push portion 53. When a force is applied to the push portion 53 and the push portion 53 is moved in the downward direction in the drawing, the elastic member 57 provided between the push portion 53 and the heat sink 20 may be compressed. When the force applied to the push portion 53 is released after the elastic member 57 is compressed, the push portion 53 may be moved in a direction opposite to a direction in which the force is applied to the push portion 53 by an elastic force of the elastic member 57. That is, the push portion 53 may be moved in the upward direction in the drawing. When the push portion 53 is moved in the upward direction, the head portion 51 may also be moved in the upward direction. The head portion 51 moved in the upward direction by the elastic force of the elastic member 57 may be fixed to the bracket 30 to allow the push pin 50 to be fixed to the bracket 30.

Next, a process in which the heat sink 20 is fastened to the PCB 10 will be described in detail with reference to FIGS. 9 to 11.

Figure 9:
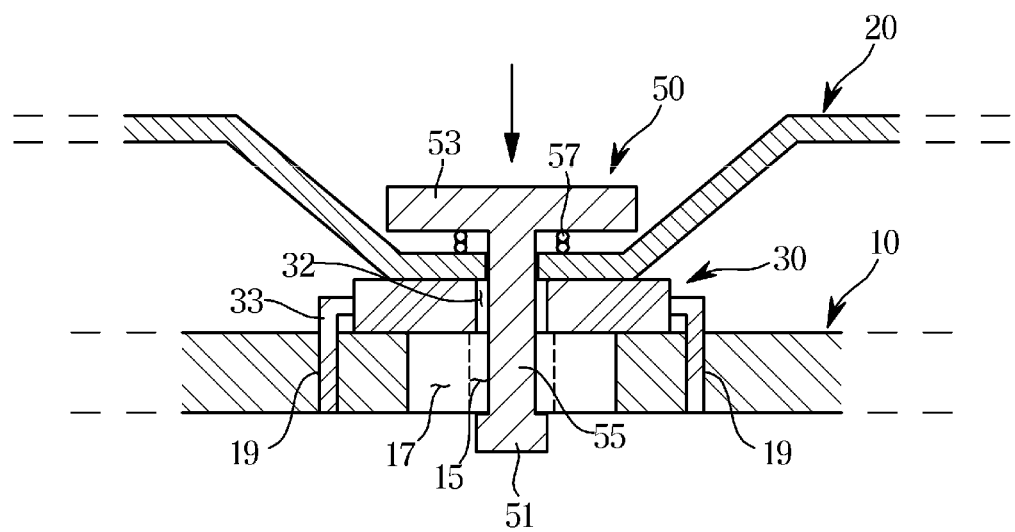
FIG. 9 schematically illustrates that a force is applied to a push portion of a push pin according to another embodiment of the disclosure, so that a head portion of the push pin penetrates a through hole and the accommodating hole.
Figure 10:
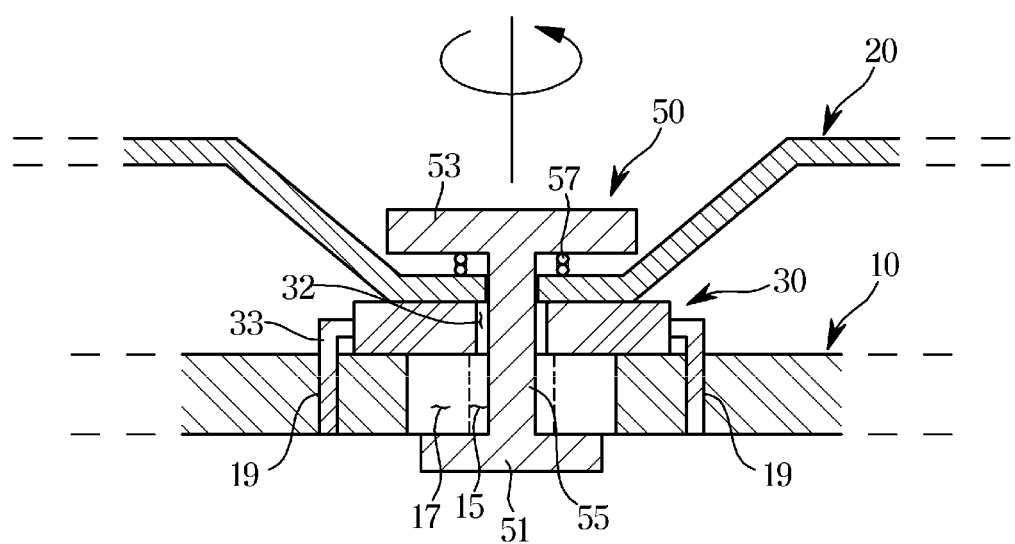
FIG. 10 schematically illustrates that the push pin in FIG. 9 is rotated by 90 degrees.
Figure 11:
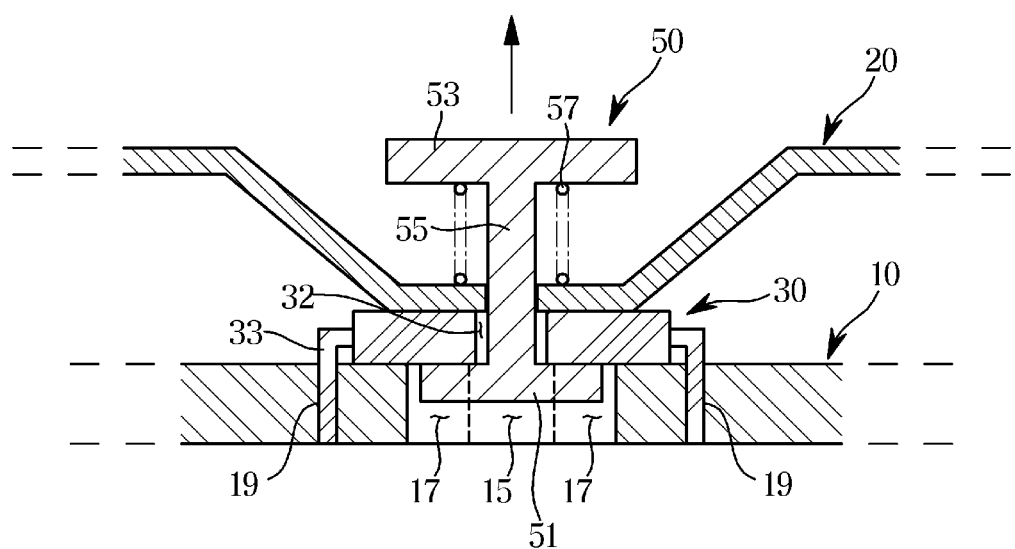
FIG. 11 schematically illustrates that the head portion of the push pin according to another embodiment of the disclosure is fixed to the bracket.

FIG. 9 schematically illustrates that a force is applied to a push portion of a push pin according to another embodiment of the disclosure, so that a head portion of the push pin penetrates a through hole and the accommodating hole, FIG. 10 schematically illustrates that the push pin in FIG. 9 is rotated by 90 degrees, and FIG. 11 schematically illustrates that the head portion of the push pin according to another embodiment of the disclosure is fixed to the bracket.

For convenience of description, a direction in which a force is applied to the push portion 53 is referred to as a downward direction, and a direction opposite to a direction in which a force is applied to the push portion 53 is referred to an upward direction.

As illustrated in FIG. 9, when a force is applied to the push portion 53, the elastic member 57 may be compressed by the push portion 53. The push portion 53 may be moved a downward direction while compressing the elastic member 57, and the head portion 51 may be moved the downward direction together with the push portion 53. The head portion 51 moving in the downward direction may be accommodated in the first accommodating hole 15 after penetrating the through hole 32. The head portion 51 accommodated in the first accommodating hole 15 may further move in the downward direction so that the entire head portion 51 may be exposed to the outside of the PCB 10. When the head portion 51 penetrates the first accommodating hole 15 so that the entire head portion 51 is exposed to the outside of the PCB 10, the push pin 50 may be rotated by 90 degrees as illustrated in FIG. 10.

When the push pin 50 is rotated by 90 degrees, the head portion 51 of the push pin 50 may be located at a position where the head portion 51 may pass through the second accommodating hole 17. When the head portion 51 is located at a position where the head portion 51 may pass through the second accommodating hole 17, the force applied to the head portion 51 may be released as illustrated in FIG. 11.

When the force applied to the head portion 51 is released, the push portion 53 may be moved in an upward direction by the elastic force of the elastic member 57. When the push portion 53 is moved in the upward direction, the head portion 51 may also be moved in the upward direction. The head portion 51 may be accommodated in the second accommodating hole 17 by being moved in the upward direction. Because the through hole 32 is provided to correspond to the first accommodating hole 15 and the second accommodating hole 17 is disposed perpendicular to the first accommodating hole 15, the head portion 51 may not be able to pass through the through hole 32 in a state of being accommodated in the second accommodating hole 17. Accordingly, the head portion 51 may be fixed to the bracket 30, and the push pin 50 may be fixed to prevent separation from the bracket 30.

As is apparent from the above, according to embodiments of the disclosure, a height of a heat sink fastened to a PCB can be reduced, thereby reducing the overall thickness of a product in which the PCB is used.

While the disclosure has been particularly described with reference to exemplary embodiments, it should be understood by those of skilled in the art that various changes in form and details may be made without departing from the spirit and scope of the disclosure.

What is claimed is:

1. A heat sink fastening structure comprising:
    a push pin to fasten a heat sink to a printed circuit board (PCB), the push pin comprising a head portion formed at an end thereof;
    a bracket mounted on the PCB, the bracket comprising a through hole formed at a central portion thereof to allow the head portion to penetrate; and
    an accommodating hole included in the PCB to accommodate the head portion therein,
    wherein the head portion is configured to penetrate the through hole, thereafter be accommodated in the accommodating hole, and support a bottom surface of the bracket, thereby fastening the heat sink to the PCB, and
    wherein the accommodation hole of the PCB has a size larger than a size of the through hole of the bracket, causing the bottom surface of the bracket to be exposed to the accommodation hole, and the head portion supports the exposed bottom surface of the bracket after passing through the through hole.

2. The heat sink fastening structure according to claim 1, wherein the push pin further comprises:
    a push portion formed an other end of the push pin; and
    a connection portion connecting the push portion and the head portion,
    wherein the head portion is configured to penetrate the through hole in response to receiving an external force on the push portion, and
    wherein the heat sink fastening structure further comprises an elastic member disposed between the push portion and the heat sink to support fastening of the heat sink to the PCB.

3. The heat sink fastening structure according to claim 2, wherein the size of the accommodating hole has is larger than a size of the head portion to accommodate the head portion therein.

4. The heat sink fastening structure according to claim 3, wherein the head portion is configured to be elastically deformable so that the head portion is deformed when penetrating the through hole.

5. The heat sink fastening structure according to claim 4, wherein in response to receiving the external force on the push portion, the head portion is configured to be inserted into the through hole while the elastic member is compressed, and the head portion inserted into the through hole is configured to penetrate the through hole by being elastically deformed to a shape passable through the through hole.

6. The heat sink fastening structure according to claim 5, wherein the elastically deformed head portion passed through the through hole is configured to return to an original shape, and the end portion of the head portion penetrated the accommodating hole is exposed to an outside of the PCB.

7. The heat sink fastening structure according to claim 6, wherein
    when the end portion of the head portion penetrated the accommodating hole is exposed to the outside of the PCB, the external force applied to the push portion is released.

8. The heat sink fastening structure according to claim 7, wherein
when the external force applied to the push portion is released, the push portion moves in a direction opposite to a direction in which the external force is applied to the push portion, together with the head portion by an elastic force of the compressed elastic member to fix the head portion to the bracket.

9. The heat sink fastening structure according to claim 2, wherein
the head portion is formed in a straight bar shape.

10. The heat sink fastening structure according to claim 9, wherein the through hole is formed in a shape corresponding to the head portion to allow the head portion to penetrate.

11. The heat sink fastening structure according to claim 2, wherein the accommodating hole is formed in a cross shape, the accommodating hole comprises:
a first accommodating hole formed in a shape corresponding to the head portion and having a size larger than that of the head portion; and
a second accommodating hole disposed perpendicular to the first accommodating hole.

12. The heat sink fastening structure according to claim 11, wherein in response to receiving the external force on the push portion, the head portion is exposed to the outside of the PCB by penetrating the through hole and the first accommodating hole while the elastic member is compressed.

13. The heat sink fastening structure according to claim 12, wherein when the head portion penetrates the first accommodating hole to be exposed to an outside of the PCB, the push pin is configured to be rotated by 90 degrees to allow the head portion to pass through the second accommodating hole.

14. The heat sink fastening structure according to claim 13, wherein
when the push pin is rotated by 90 degrees and the external force applied to the push portion is released, the push portion moves in a direction opposite to a direction in which the external force is applied to the push portion, together with the head portion by an elastic force of the compressed elastic member to fix the head portion to the bracket.

15. The heat sink fastening structure according to claim 1, wherein
the bracket further comprises a plurality of fixing portions, and the PCB comprises a plurality of fixing holes into which the plurality of fixing portions is inserted and fixed.

16. A heat sink fastening structure comprising:
a push pin to fasten a heat sink to a printed circuit board (PCB), the push pin comprising a head portion formed in a straight bar shape;
a bracket mounted on the PCB, the bracket comprising a through hole formed at a central portion thereof, the through hole having a shape corresponding to the head portion to allow the head portion to penetrate; and
an accommodating hole included in the PCB to accommodate the head portion therein, the accommodating hole comprising:
a first accommodating hole formed in a shape corresponding to the head portion and having a size larger than a size of the head portion; and
a second accommodating hole disposed perpendicular to the first accommodating hole,
wherein when the head portion is configured to penetrate the through hole and the first accommodating hole, thereafter rotate the push pin by 90 degrees to allow the head portion to be accommodated in the second accommodating hole, and support a bottom surface of the bracket so that the head portion does not to pass through the through hole, thereby fastening the heat sink to the PCB.

17. The heat sink fastening structure according to claim 16, wherein the push pin further comprises:
a push portion; and
a connection portion connecting the push portion and the head portion,
wherein the head portion is configured to penetrate the through hole in response to receiving an external force on the push portion, and
wherein the heat sink fastening structure further comprises an elastic member disposed between the head portion and the heat sink to support fastening of the heat sink to the PCB.

18. The heat sink fastening structure according to claim 17, wherein
when the external force is applied to the push portion, the head portion moves to penetrate the through hole and the first accommodating hole while the elastic member is compressed, and when the push pin is rotated by 90 degrees and then the external force applied to the push portion is released, the head portion is fixed to the bracket by being moved to be accommodated in the second accommodating hole by an elastic force of the compressed elastic member.

* * * * *